(12) United States Patent
Tseng et al.

(10) Patent No.: US 12,372,179 B1
(45) Date of Patent: Jul. 29, 2025

(54) FLOATING JOINT AND RETAINER CONNECTION DEVICE WITH FRICTION REDUCTION STRUCTURE

(71) Applicant: FOSITEK CORPORATION, New Taipei (TW)

(72) Inventors: Yung-Chih Tseng, New Taipei (TW); Hao-Yun Lee, New Taipei (TW); Dai-Rong Li, New Taipei (TW); He-Yu Kang, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 18/797,926

(22) Filed: Aug. 8, 2024

(30) Foreign Application Priority Data

Jul. 29, 2024 (TW) ................................. 113128161

(51) Int. Cl.
*F16L 27/00* (2006.01)
*F16L 27/12* (2006.01)
*H05K 7/20* (2006.01)

(52) U.S. Cl.
CPC .......... *F16L 27/12* (2013.01); *H05K 7/20272* (2013.01); *H05K 7/20781* (2013.01)

(58) Field of Classification Search
CPC ....... F16L 27/00; F16L 27/08; F16L 27/0824; F16L 27/10; F16L 27/1008; F16L 27/1021; F16L 27/12; F16L 27/125; F16L 33/225; F16L 39/04; F16L 41/005; F16L 41/007; F16L 49/08
See application file for complete search history.

(56) References Cited

U.S. PATENT DOCUMENTS

| | | | | |
|---|---|---|---|---|
| 1,489,277 A | * | 4/1924 | Rains | F16L 39/04 285/94 |
| 2,175,752 A | * | 10/1939 | Gray | F16L 27/00 285/94 |
| 2,180,407 A | * | 11/1939 | Few | F16L 39/04 285/94 |
| 2,361,811 A | * | 10/1944 | Badger | F16L 39/04 285/121.7 |
| 2,385,421 A | * | 9/1945 | Monroe | F16L 39/04 285/263 |
| 2,700,558 A | * | 1/1955 | Hieronymus | F16L 27/023 277/366 |

(Continued)

*Primary Examiner* — Aaron M Dunwoody
(74) *Attorney, Agent, or Firm* — Demian K. Jackson; Jackson IPG PLLC

(57) ABSTRACT

A floating joint and retainer connection device includes a fixed retainer internally defines a receiving space; an adaptor joint having an end extending through the receiving space to an outer side of the fixed retainer and an axially limiting section formed near another end; a fixing element fitted on the adaptor joint and located outside the fixed retainer for limiting the adaptor joint from moving axially while allowing the adaptor joint to displace radially relative to the fixed retainer; a rolling assembly disposed adjoining the fixed retainer; and a spring located in the receiving space and fitted on the adaptor joint with two ends pressed against the axially limiting section and the fixed retainer or the rolling assembly. When the rolling assembly rolls to displace radially relative to the fixed retainer, a radial frictional force produced by a normal force applied by the spring to the fixed retainer is reduced.

6 Claims, 3 Drawing Sheets

(56) References Cited

U.S. PATENT DOCUMENTS

| | | | | |
|---|---|---|---|---|
| 2,794,659 | A * | 6/1957 | Bily | F16L 27/082 285/276 |
| 3,446,245 | A * | 5/1969 | Snyder, Jr. | F16L 15/008 285/276 |
| 3,484,853 | A * | 12/1969 | Nishi | F16L 27/0812 285/279 |
| 4,254,972 | A * | 3/1981 | Wiedenbeck | F16L 39/04 285/422 |
| 4,786,061 | A * | 11/1988 | Buchalla | F16L 27/087 277/408 |
| 4,886,301 | A * | 12/1989 | Remsburg | F16L 37/56 285/39 |
| 6,003,907 | A * | 12/1999 | Gau | F16L 27/0824 384/514 |
| 11,746,942 | B2 * | 9/2023 | Durieux | F16L 37/56 251/149.6 |
| 11,815,214 | B2 * | 11/2023 | Nick | H05K 7/20781 |
| 12,247,685 | B2 * | 3/2025 | Marquis | F16L 37/52 |
| 2008/0168769 | A1 * | 7/2008 | Preimesberger | F16L 27/1021 285/27 |
| 2008/0217909 | A1 * | 9/2008 | De Ridder | F16L 49/08 285/95 |
| 2015/0219259 | A1 * | 8/2015 | Weems | F16L 27/0816 285/272 |
| 2016/0047191 | A1 * | 2/2016 | Stachowiak, Jr. | F16L 21/035 285/119 |
| 2018/0187807 | A1 * | 7/2018 | Reinhardt | E03C 1/021 |
| 2019/0285211 | A1 * | 9/2019 | Von Keitz | F16L 27/1012 |
| 2022/0349503 | A1 * | 11/2022 | Durieux | F16L 37/02 |
| 2022/0412496 | A1 * | 12/2022 | Nick | F16L 37/52 |
| 2023/0143344 | A1 * | 5/2023 | Marquis | F16L 37/52 285/261 |
| 2024/0077160 | A1 * | 3/2024 | Zhang | F16L 37/56 |
| 2024/0125418 | A1 * | 4/2024 | Shende | F16L 27/04 |

* cited by examiner

FLOATING JOINT AND RETAINER CONNECTION DEVICE WITH FRICTION REDUCTION STRUCTURE

This application claims the priority benefit of Taiwan patent application number 113128161 filed on Jul. 29, 2024, the disclosure of which is hereby incorporated by reference in its entirety.

FIELD OF THE INVENTION

The present invention relates to a floating joint and retainer connection device with friction reduction structure, and more particularly, to a floating joint and retainer connection device that includes a rolling assembly, which rolls to reduce a frictional force between an adaptor joint and a fixed retainer when the adaptor joint is displaced radially relative to the fixed retainer.

BACKGROUND OF THE INVENTION

The existing server has highly increased computing performance, but the computing unit therein also produces more heat. Since there is a plurality of servers mounted in one server cabinet and the servers are closely arranged in the server cabinet with a relatively small space left between them, it is impossible to provide an additional thermal module for each of the servers to dissipate the heat produced by them. Therefore, there are manufacturers who try to remove the heat from the servers in the server cabinet by water cooling. In consideration of the precision electronic parts in the servers, it is necessary to prevent all pipe joints in the water cooling system from leaking, so as to protect the electronic parts from damages caused by water leaking. For this purpose, most of the pipes for the water cooling system for the servers are made of hard or metal materials. A male and a female quick coupler are correspondingly provided on the server (i.e. a movable side) and the server cabinet (i.e. a fixed side) to enable quick connection of the server to the server cabinet end to end, such that water pipes provided on the movable side and the fixed side can be quickly connected or disconnected. Usually, a small radial tolerance would exist between the male and the female coupler to be connected to each other, and it is necessary to correct the radial tolerance quickly. For this purpose, at least one guide stem is provided on the fixed side (i.e. the server cabinet) near a position having the female coupler mounted thereto and a guide block internally defining a guiding bore is provided on the movable side (i.e. the server) near a position having the male coupler mounted thereto in correspondence with the guide stem. To assemble the male and the female coupler to each other, first insert the guide stem into the guiding bore in the guide block. Through guiding of the guide stem and the guide block, the two quick couplers initially having a radial tolerance between them are guided to an almost concentric position, so that the two quick couplers can be serially connected end to end.

There are other manufacturers who omit the guide stem and the guide block to save the space in the server cabinet. For this purpose, a fixed retainer and an adaptor joint for correcting the radial offset are provided on the female coupler and the male coupler, respectively, and a beveled surface is provided in the guiding bore of the female coupler at a position that contacts with the adaptor joint first when the female coupler is connected to the male coupler end to end. When connecting the female and the male coupler, the adaptor joint can be displaced radially relative to the fixed retainer to correct the radial offset of the male coupler from the female coupler. And, two washers are used to clamp the adaptor joint to the fixed retainer by applying a normal force to the adaptor joint and the fixed retainer, so that the adaptor joint can stay at a fixed position after it is displaced radially relative to the fixed retainer.

The normal force comes from a preloaded spring disposed between the adaptor joint and the fixed retainer. In the event the normal force applied by the spring should produce a too large frictional force between the adaptor joint and the fixed retainer when the adaptor joint is displaced radially, it would be difficult for the adaptor joint to displace radially and impossible for the adaptor joint to stay at a desired position relative to the fixed retainer. It is therefore an important goal of the manufacturing field to overcome the above-mentioned problem.

SUMMARY OF THE INVENTION

To effectively solve the above problems, a primary object of the present invention is to provide a floating joint and retainer connection device with friction reduction structure. The friction reduction structure includes a rolling assembly, which rolls to reduce a frictional force between an adaptor joint and a fixed retainer when the adaptor joint is displaced radially relative to the fixed retainer and accordingly, enables effective control of the adaptor joint to stay at a final position after it is displaced radially relative to the fixed joint.

To achieve the above and other objects, the floating joint and retainer connection device with friction reduction structure according to the present invention includes a fixed retainer, an adaptor joint, a fixing element, a rolling assembly, and a spring.

The fixed retainer has a first side and a second side and internally defines a receiving space located between the first and the second side. The first side is an open side and the second side is a closed side provided with a through hole communicable with the receiving space. The adaptor joint has an engaging section and a fitting section, and includes a buffering section located between the engaging section and the fitting section. The fitting section extends through the receiving space to project from the second side of the fixed retainer via the through hole. And, an axially limiting section is formed at a junction of the engaging section and the buffering section. The fixing element is fitted on around the fitting section of the adaptor joint and located at an outer side of the second side of the fixed retainer for limiting the adaptor joint from moving axially relative to the fixed retainer but allowing the adaptor joint to displace radially relative to the fixed retainer. The at least one rolling assembly is disposed on at least one side of the second side of the fixed retainer for rolling relative to the second side of the fixed retainer. The spring is disposed in the receiving space of the fixed retainer and fitted around the buffering section of the adaptor joint with an end of the spring pressed against the axially liming section and another end located at one side of the rolling assembly facing away from the second side of the fixed retainer. In the above structure, the rolling assembly can roll relative to the second side of the fixed retainer to reduce a radial frictional force produced by a normal force applied by the spring on the second side of the fixed retainer.

With the friction reduction structure, the floating joint and retainer connection device of the present invention can effectively reduce the frictional force between the adaptor joint and the fixed retainer when the adaptor joint is displaced radially relative to the fixed retainer, and the adaptor joint can stably suspend at a desired final position after being displaced radially relative to the fixed retainer.

BRIEF DESCRIPTION OF THE DRAWINGS

The structure and the technical means adopted by the present invention to achieve the above and other objects can be best understood by referring to the following detailed description of the preferred embodiment and the accompanying drawings, wherein.

DETAILED DESCRIPTION OF THE PREFERRED EMBODIMENTS

Figure 1:
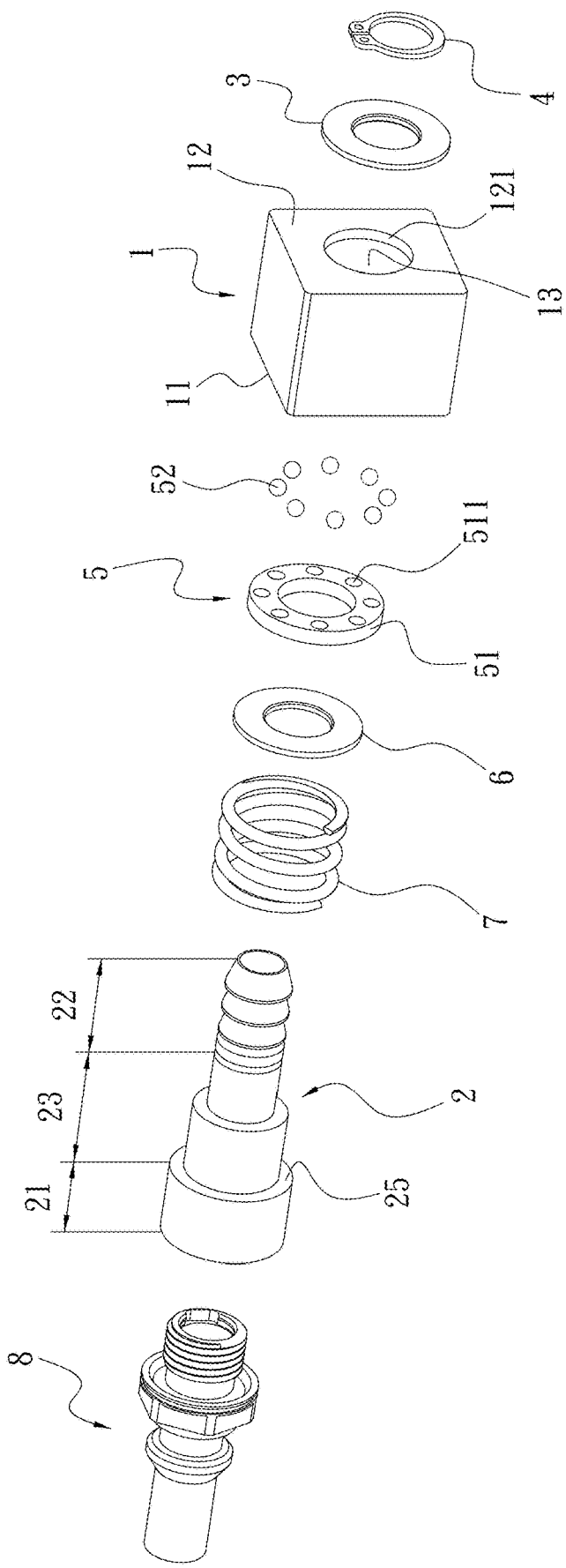
FIG. 1 is an exploded perspective view of a floating joint and retainer connection device with friction reduction structure according to an embodiment of the present invention.

The present invention will now be described with some preferred embodiments thereof. For the purpose of easy to understand, elements that are the same in the preferred embodiments are denoted by the same reference numerals.

Figure 2:
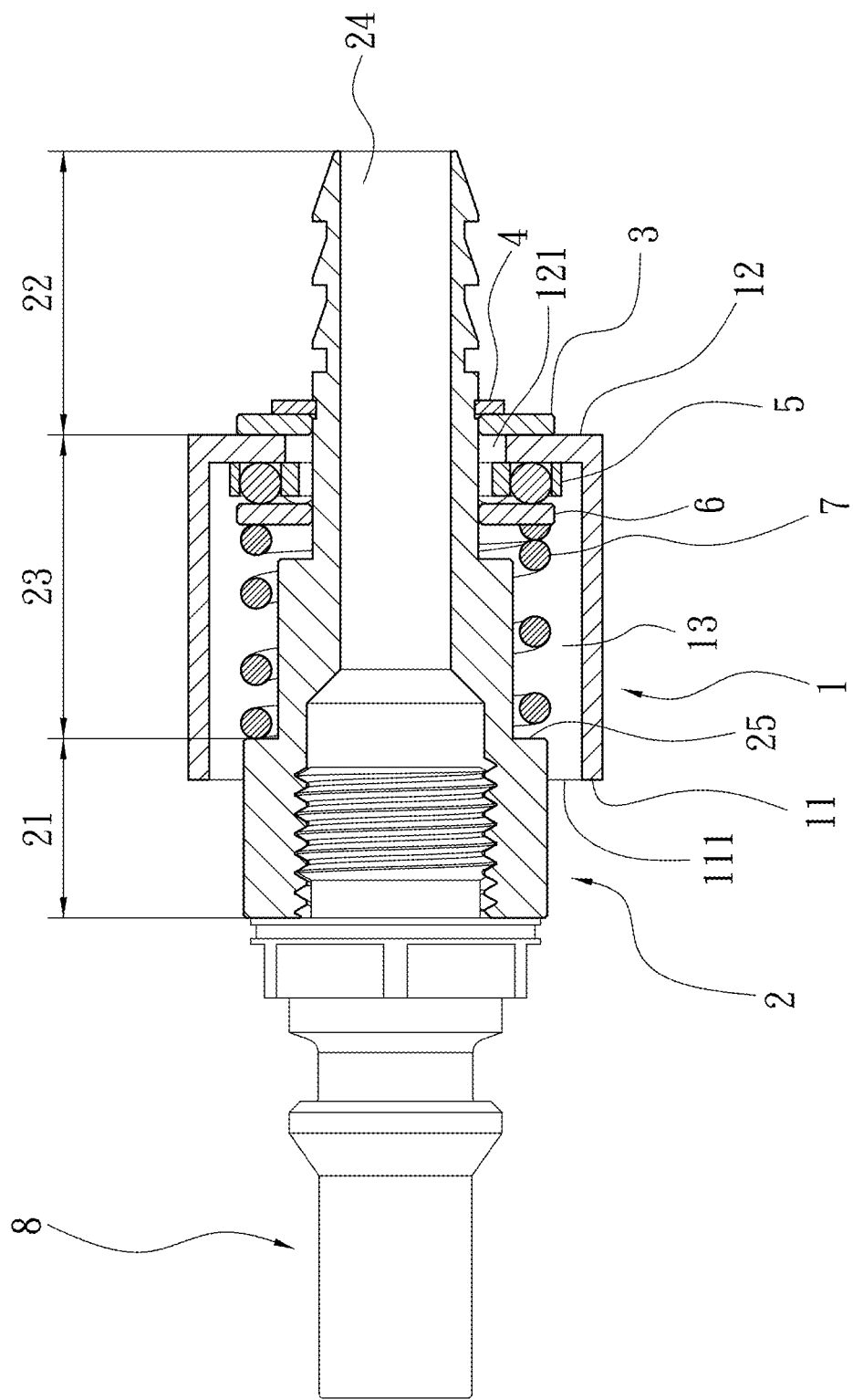
FIG. 2 is an assembled sectional view of FIG. 1.

Please refer to FIGS. 1 and 2, which are exploded perspective and assembled sectional views, respectively, of a floating joint and retainer connection device with friction reduction structure according to an embodiment of the present invention. As shown, the present invention includes a fixed retainer 1, an adaptor joint 2, a fixing element 4, a rolling assembly 5, and a spring 7.

The fixed retainer 1 has a first side 11 and a second side 12 located axially opposite to each other, and internally defines a receiving space 13 located between the first side 11 and the second side 12. The first side 11 is in an open state defining a penetrating opening 111 communicable with the receiving space 13 and. The second side 12 is a closed side provided with a through hole 121 communicable with the receiving space 13.

The adaptor joint 2 has an engaging section 21 and a fitting end 22 located axially opposite to each other, and a buffering section 23 located between the engaging section 21 and the fitting section 22. The fitting section 22 of the adaptor joint 2 is extended through the receiving space 13 to an outer side of the fixed retainer 1 via the through hole 121. The engaging section 21 has an outer diameter larger than that of the buffering section 23, such that an axially limiting section 25 is formed at a junction of the engaging section 21 and the buffering section 23. And, the through hole 121 has an inner diameter larger than an outer diameter of the fitting section 22.

The engaging section 21 of the adaptor joint 2 may be, for example, connected to a male coupler 8. Alternatively, the engaging section 21 may be connected to other structure or other element or may be extended to engage with other structure without being particularly limited to any form.

The fixing element 4 is fitted on the fitting section 22 of the adaptor joint 2 and is located at an outer side of the second side 12 of the fixed retainer 1, so as to limit the adaptor joint 2 from moving axially relative to the fixed retainer 1 but allow the adaptor joint 2 to displace radially relative to the fixed retainer 1. The fixing element 4 can be a retaining ring, a nut, or a C-ring. And, the fitting section 22 is provided on an outer surface with an annular groove or screw threads for correspondingly receiving the retaining ring or the nut therein.

In the illustrated first embodiment of the present invention, the rolling assembly 5 and the spring 7 are located in the receiving space 13 of the fixed retainer 1 and are fitted around the buffering section 23 of the adaptor joint 2.

Wherein, the rolling assembly 5 is disposed adjoining the second side 12 of the fixed retainer 1. More specifically, the at least one rolling assembly 5 can be selectively provided on one or both of an inner side and an outer side of the second side of the fixed retainer 1. However, in the illustrated embodiment, as shown in FIG. 2, the rolling assembly 5 is disposed on the inner side of the second side 12 to roll relative to the inner side of the second side 12 of the fixed retainer 1.

In this case, the spring 7 has an end pressed against the axially limiting section 25 on the adaptor joint 2, and another end located on one side of the rolling assembly 5 facing away from the second side 12. Since a length between the axially limiting section 25 and the second side 12 of the fixed retainer 1 is smaller than a free length of the spring 7 when the two ends thereof are not subjected to any external force, the spring 7 fitted in the receiving space 13 is axially compressed and has a preload to apply two opposite normal forces to the axially limiting section 25 of the adaptor joint 2 and the rolling assembly 5. Since the rolling assembly 5 is located between one end of the spring 7 and the second side 12 of the fixed retainer 1 and can roll relative to the second side 12, a radial frictional force produced by the normal force applied by the end of the spring 7 to the fixed retainer 1 is reduced.

The rolling assembly 5 includes a holding member 51 and a plurality of rolling units 52. Specifically, the rolling unit 52 can be any structure that can roll relative to a planar surface, such as a roller, a ball, etc. In the illustrated embodiments of the present invention, the rolling units 52 are balls. The holding member 51 includes a plurality of engaging holes 511 for receiving the rolling units 52 therein, such that the rolling units 52 can roll in the engaging holes 511. The engaging holes 511 of the rolling assembly 5 penetrate through the holding member 51 from one side to another side, and the rolling units 52 are partially protruded from both sides of the holding member 51.

In this case, a slidable spacer 6 is disposed adjoining one side of the holding member 51 facing away from the second side 12 of the fixed retainer 1 and is located between the rolling assembly 5 and the spring 7. Therefore, the spring 7 has one end pressed against the slidable spacer 6 of the rolling assembly 5 to indirectly contact with the protruded portions of the rolling units 52 via the slidable spacer 6. When a normal force is applied by the spring 7 to the slidable spacer 6, the rolling units 52 of the rolling assembly 5 are in contact with the second side 12 of the fixed retainer 1. When the rolling units 52 roll, the rolling assembly 5 is brought to displace radially relative to the second side 12, and the radial frictional force produced by the normal force applied by the spring 7 to the fixed retainer 1 is reduced.

A slidable washer 3 can be provided on another side (i.e. an outer side) of the second side 12 of the fixed retainer 1 to be located adjoining the second side 12. The slidable washer 3 is fitted on around the fitting section 22 of the adaptor joint 2 and is located between the fixing element 4 and the second side 12 of the fixed retainer 1 to provide a buffering function during the radial displacement of the adaptor joint 2 relative to the fixed retainer 1. In this manner, the normal force applied by the spring 7 is transmitted to the slidable washer 3 via the adaptor joint 2 and the fixing element 4, such that the slidable spacer 6 and the slidable washer 3 are subjected to two normal forces applied thereto from two opposite directions. The slidable spacer 6 is directly subjected to the normal force from the spring 7 toward the second side 12 of the fixed retainer 1 to thereby tightly press against one side of the rolling assembly 5, while the other side of the rolling assembly 5 is tightly pressed against the inner side of the second side 12 of the fixed retainer 1. Meanwhile, the slidable washer 3 is also subjected to the normal force from the spring 7 to tightly press against the outer side of the second side 12. Thus, the slidable spacer 6 and the slidable washer 3 clamp the second side 12 of the fixed retainer 1 between them from two opposite directions.

Figure 3:
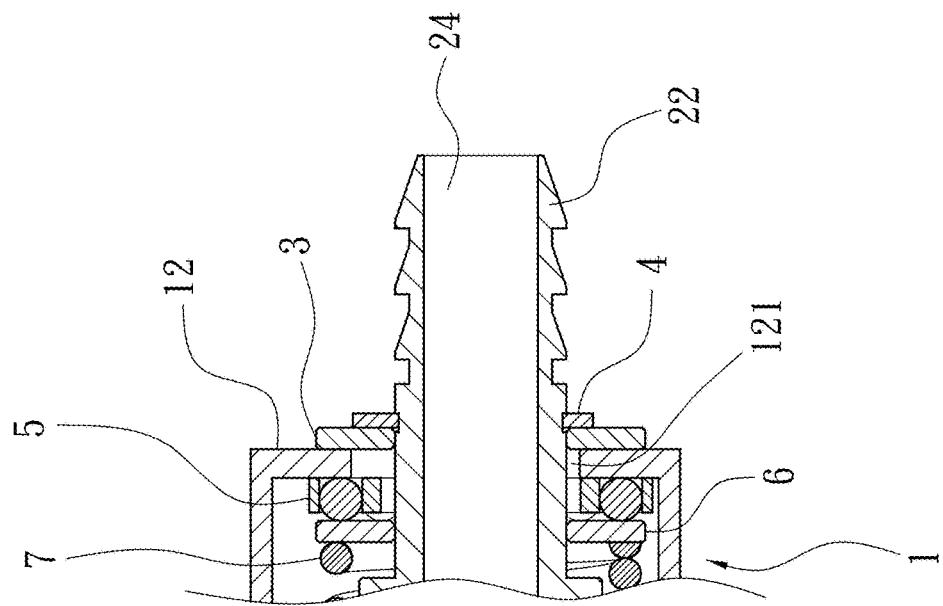
FIGS. 3 and 4 are fragmentary sectional views showing the present invention before and after an adaptor joint is displaced radially relative to a fixed retainer, respectively.
Figure 4:
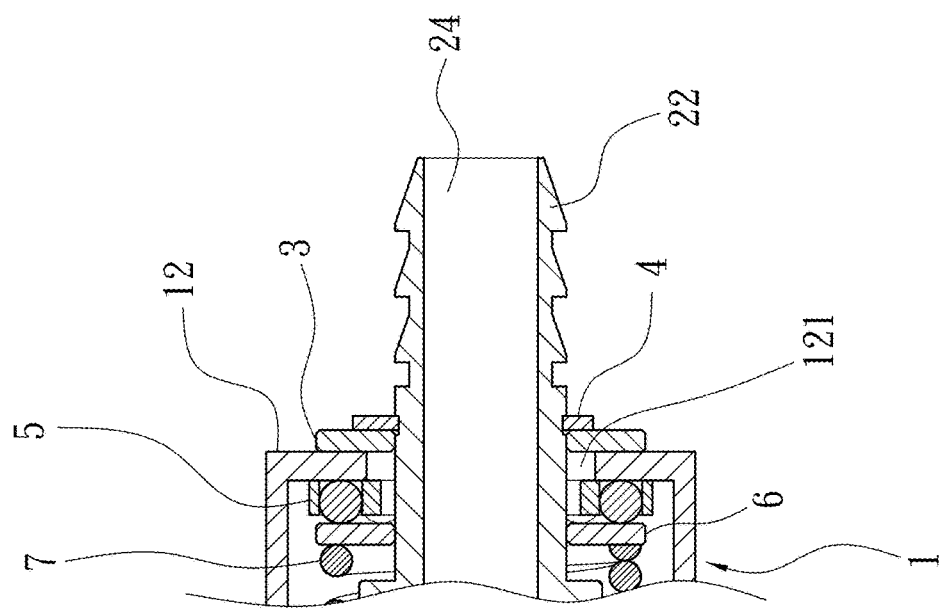

Please refer to FIGS. 3 and 4, which show the floating joint and retainer connection device with friction reduction structure according to the present invention before and after the adaptor joint 2 is displaced radially relative to the fixed retainer 1. Please refer to FIGS. 3 and 4 along with FIGS. 1 and 2. The rolling assembly 5 is in contact with and can roll radially relative to the inner side of the second side 12 of the fixed retainer 1 to reduce the radial frictional force. With this arrangement, it is able to avoid the problem of wear of the adaptor joint and the fixed retainer 1 caused by a large radial frictional force between them due to a large normal force applied by the spring 7 to the fixed retainer 1. Therefore, with the present invention, the adaptor joint 2 can be more smoothly displaced radially to align with the fixed retainer 1, and the adaptor joint 2 can stably stay and suspend at a final position after the radial displacement with the aid of the rolling assembly 5.

In the past, the adaptor joint 2 might not be smoothly displaced radially relative to the fixed retainer 1 to align with the fixed retainer 1 when the spring 7 exerts a too large normal force to produce a relatively large radial frictional force between the fixed retainer 1 and the slidable washer 3 and the slidable spacer 6.

With the present invention, the rolling assembly 5 can roll to displace radially relative to the second side 12 of the fixed retainer 1 to reduce the frictional force between the fixed retainer 1 and the spring 7, the slidable spacer 6, and the slidable washer 3. And, the adaptor joint 2 having been displaced radially can stay and suspend at any desired position. Therefore, the present invention overcomes the problem of large frictional force in the prior art caused by the large normal force applied by the spring.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A floating joint and retainer connection device with friction reduction structure, comprising:
    a fixed retainer having a first side and a second side and internally defining a receiving space located between the first and the second side; the first side being an open side and the second side being a closed side provided with a through hole communicable with the receiving space;
    an adaptor joint having an engaging section and a fitting section, and including a buffering section located between the engaging section and the fitting section; the fitting section extending through the receiving space to project from the second side of the fixed retainer via the through hole; and an axially limiting section being formed at a junction of the engaging section and the buffering section;
    a fixing element being fitted on around the fitting section of the adaptor joint and located at an outer side of the second side of the fixed retainer for limiting the adaptor joint from moving axially relative to the fixed retainer but allowing the adaptor joint to displace radially relative to the fixed retainer;
    at least one rolling assembly being disposed on at least one side of the second side of the fixed retainer for rolling relative to the second side of the fixed retainer; and
    a spring being disposed in the receiving space of the fixed retainer and fitted around the buffering section of the adaptor joint with an end of the spring pressed against the axially liming section and another end located at one side of the rolling assembly facing away from the second side of the fixed retainer.

2. The floating joint and retainer connection device with friction reduction structure as claimed in claim 1, wherein the rolling assembly includes a holding member and a plurality of rolling units, and the holding member being provided with a plurality of engaging holes for respectively receiving one of the rolling units therein.

3. The floating joint and retainer connection device with friction reduction structure as claimed in claim 2, further comprising a slidable spacer located adjoining one side of the holding member facing away from the second side.

4. The floating joint and retainer connection device with friction reduction structure as claimed in claim 1, wherein the at least one rolling assembly is disposed on an inner side of the second side of the fixed retainer.

5. The floating joint and retainer connection device with friction reduction structure as claimed in claim 4, further comprising a slidable washer disposed on another side of the second side of the fixed retainer to be located adjoining the second side.

6. The floating joint and retainer connection device with friction reduction structure as claimed in claim 1, wherein the fixing element is selected from the group consisting of a retaining ring and a nut; and the through hole on the second side of the fixed retainer has an inner diameter larger than an outer diameter of the fitting section of the adaptor joint.

* * * * *